United States Patent [19]

Hashimoto et al.

[11] Patent Number: 4,916,541
[45] Date of Patent: Apr. 10, 1990

[54] PICTURE PROCESSOR

[75] Inventors: Masashi Hashimoto; Kenji Sasaki, both of Miho, Japan

[73] Assignee: Texas Instruments Incorporated, Dallas, Tex.

[21] Appl. No.: 40,453

[22] Filed: Apr. 16, 1987

[30] Foreign Application Priority Data

Apr. 21, 1986 [JP] Japan ................. 61-091674

[51] Int. Cl.$^4$ ............................................. H04N 5/14
[52] U.S. Cl. .................................. 358/160; 358/21 R
[58] Field of Search ................. 358/160, 21 R, 22, 11, 358/12, 140, 141, 183, 213.25, 213.26; 365/45, 189, 194; 340/799, 800

[56] References Cited

U.S. PATENT DOCUMENTS

| | | | |
|---|---|---|---|
| 4,183,058 | 1/1980 | Taylor | 358/127 |
| 4,485,402 | 11/1984 | Searby | 358/160 |
| 4,536,795 | 8/1985 | Hirota et al. | 358/160 |
| 4,614,979 | 9/1986 | Sugiyama et al. | 358/335 |

FOREIGN PATENT DOCUMENTS

| | | |
|---|---|---|
| 3334053 | 3/1984 | Fed. Rep. of Germany . |
| 2510854 | 2/1983 | France . |
| 2139843 | 11/1984 | United Kingdom . |

OTHER PUBLICATIONS

"A 1Mb DRAM with 33 MHz Ser. I/O Ports", Ohta et al, *IEEE International Solid-State Circuits Conference*, pp. 274–275 (Feb. 21, 1986), and Accompanying Product Description, 1 Mbit Image Memory MN4700 Product Description.

"1985 Memory Products Data Book" and 1986 Memory Data Book, *NEC Electronics Inc.*

*Primary Examiner*—John W. Shepperd
*Assistant Examiner*—Michael D. Parker
*Attorney, Agent, or Firm*—William E. Hiller; N. Rhys Merrett; Melvin Sharp

[57] ABSTRACT

A picture processor comprising a memory array for storing video data involving at least one picture frame and a line buffer memory for processing at a high rate video signals included in one scan line of picture frame.

29 Claims, 9 Drawing Sheets

PICTURE PROCESSOR

BACKGROUND OF THE INVENTION

1. Field of the Invention

This invention relates to a picture processor and more particularly a semiconductor memory for use in video signal processing.

2. Description of the Prior Art

Conventional semiconductor memories for use in picture processing are known, as for example, a video random access memory (V-RAM), field memory and line memory, all of which are produced commercially. Each of these forms of memories is of the type in which video data is written thereinto and, after being subjected to desired processing, readout therefrom.

With respect to a V-RAM, as the term represents, video data can be randomly read from or written into such a memory for complex video signal processing, and a graphic display can be performed. The feature of randomly processing all bits, however, makes the V-RAM relatively complicated in providing for the control of address signals for identifying individual bits therein. Furthermore, externally supplied address signals require more address pins in an integrated circuit assembly of a V-RAM structure. This aspect adds to the difficulty in the manufacture of high packaging density circuit boards.

On the other hand, it would be desirable for image reproduction TV and VTR to employ memory devices permitting video data processing with minimal control signals for achieving higher packaging density on a circuit board as opposed to a random access function obtained through the use of a V-RAM structure. To this end, field memory and line memory structures have been developed. Generally, a field memory is used for a still picture, double speed or slow reproduction images. A line memory is useful in improving the picture quality (drop out correction), time base corrector (jitter correction), interlace (interlaced scanning) to non-interlace (sequential scanning) conversion, etc. Field memories and line memories perform their functions in the storage of video data and the accessing thereof without needing external address signals, which is reflected in a smaller number of control signals being involved in the processing of video data stored therein, and consequently a reduction in the number of pins required in an integrated circuit package incorporating such memory structures. Thus, a higher package density and a smaller-size circuit board can be realized with such memory structures. However, no success has been achieved with field and line memories in video data processing toward the realization of characters-in-picture or still picture-in-picture on a TV display screen.

OBJECTS AND SUMMARY OF THE INVENTION

It is an object of the invention to provide a picture processor having the advantage of performing video data processing functions without needing external address signals and having the capability of performing an additional video data processing function enabling the reproduction of an arbitrary sub-picture at any intended location, as on a TV or VTR screen.

Another object of the invention is to provide a picture processor combining the video data processing functions attributed to both line memory and field memory structures, such as the display of a still picture, twice higher speed and slow reproduction, drop out correction, time base corrector, and interlace to non-interlace conversion, for example.

Thus, a picture processor according to the present invention may be characterized as comprising a memory array for storing video data involving at least one picture frame and line buffer memories for rapidly processing video data included in one line of the picture frame.

A preferred embodiment of a picture processor according to the invention comprises a field or frame memory array for storing video data for at least one picture frame; a line buffer memory capable of asynchronously writing and reading video data included in one scan line (1H), which is switchable into a read-only line buffer memory; a write-only line buffer memory capable of writing video data included in one scan line asynchronously with the readout timing of the above-mentioned read-only line buffer memory; and an address generating circuit section including a row address counter for receiving external signals and generating sequentially internal addresses.

Further, a preferred memory unit for use in a picture processor according to the invention comprises a line buffer memory of the above-mentioned type including a write-only line memory section and a read-only line memory section capable of reading at a speed two times higher than the writing speed.

Other objects, features and advantages of the invention will become more fully apparent from the following detailed description thereof when taken in connection with the accompanying drawings.

DESCRIPTION OF THE PREFERRED EMBODIMENTS

Figure 1:
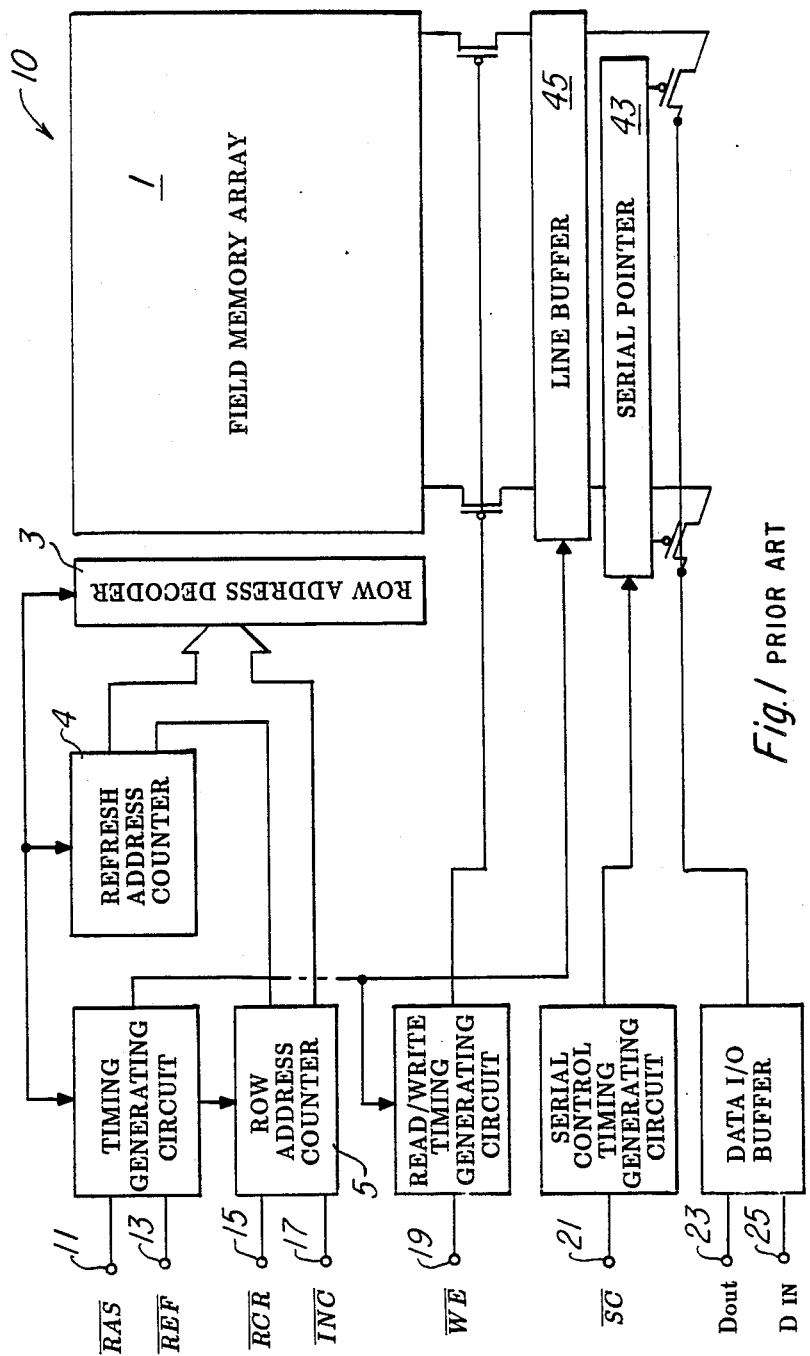
FIG. 1 is a block diagram illustrating a field memory of conventional configuration.
Figure 2:
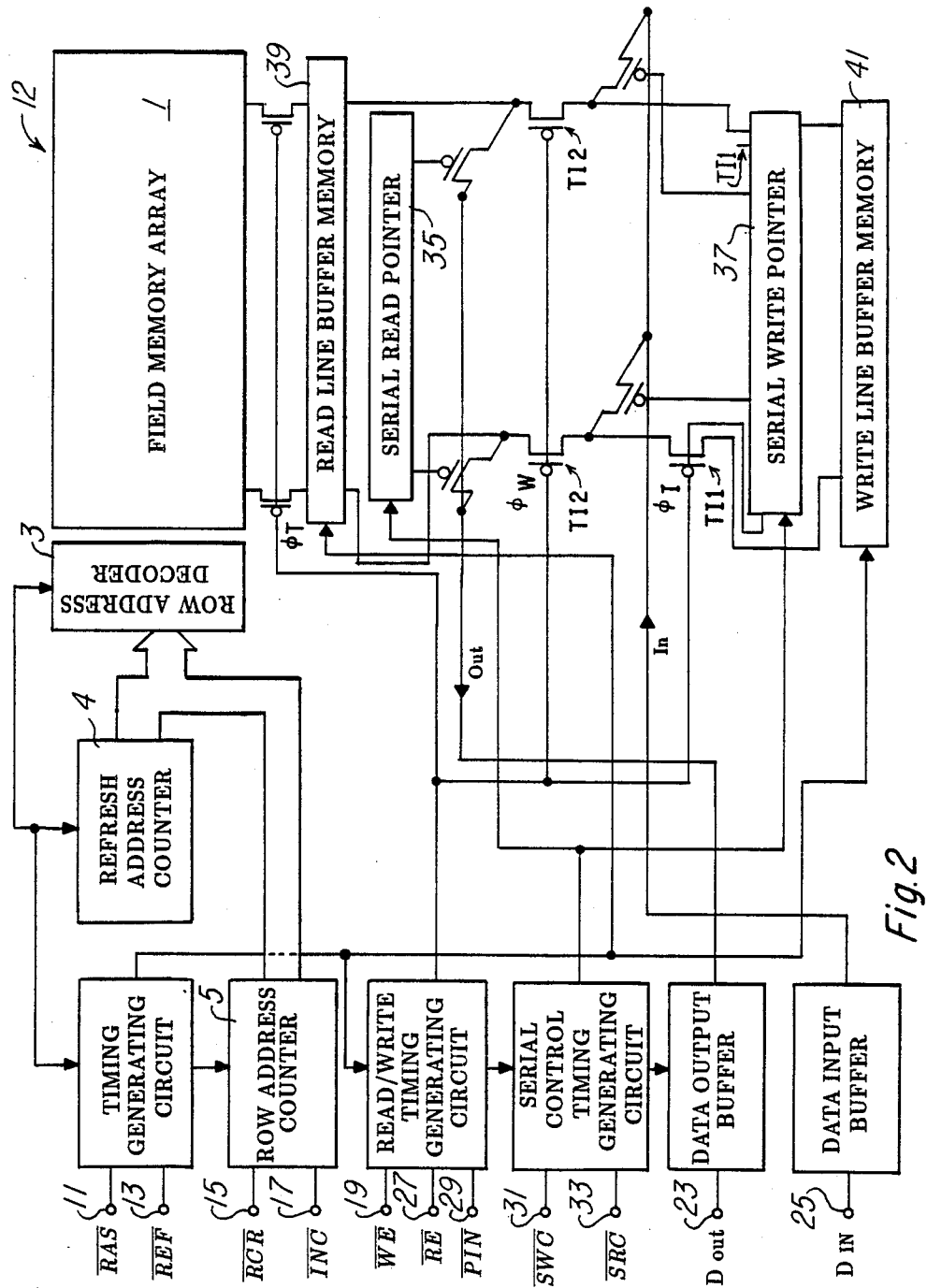
FIG. 2 is a block diagram illustrating a picture processing memory system in accordance with the present invention.

For purposes of comparison, FIG. 1 illustrates a block diagram of a known field memory unit, whereas FIG. 2 is a block diagram of a picture processing memory system as constructed in accordance with the present invention.

Most blocks shown in the block diagram of FIG. 2 have the same functions as those of FIG. 1, and hence the detailed circuit configurations of such blocks at a transistor level are not shown.

The operations of the known field memory unit shown in FIG. 1 are described in detail in "Nikkey Electronics" issued on Feb. 11, 1985, pp. 219-239. An explanation of a line memory is given in "NEC Development Prompt Report, µPD41101C", 1985. Thus, a detailed description of the basic operations of a field memory or a line memory is not provided herein, except insofar as necessary to understand the present invention.

The basic functions of individual sections and pins are described in the following:

(1) Row address signal ($\overline{RAS}$) pin 11

A $\overline{RAS}$ signal at pin 11 prepares a row address increment ($\overline{INC}$) pin 17 and row counter reset ($\overline{RCR}$) pin 15 for receiving incoming pulses and applying these to a row address decoder 3. At the same time, a serial read pointer 35 and a serial write pointer 37 are reset and set at the first bit of data to the read line buffer memory 39 and the first bit of data to a write line buffer memory 41, respectively.

(2) Refresh ($\overline{REF}$) pin 13

A $\overline{REF}$ signal at pin 13 enables the refresh operation of a field memory array 1 through a refresh address counter 4.

(3) $\overline{RCR}$ pin 15, $\overline{INC}$ pin 17

The $\overline{RCR}$ pin 15 receives external pulses and resets the row address counter 5 to the first row. The $\overline{INC}$ pin 17 accepts external pulses and increments the row address counter 5 one row address for each pulse. These functions are accomplished through the row address counter 5.

(4) $\overline{WE}$ pin 19, $\overline{RE}$ pin 27

The $\overline{WE}$ signal at pin 19 allows data received through a data input to be written into the write line buffer memory 41. The $\overline{RE}$ signal at pin 27 allows readout of data from the read line buffer memory 39 to a data output.

(5) $\overline{SWC}$ pin 31, $\overline{SRC}$ pin 33

The $\overline{SWC}$ pin 31 receives external pulses in accordance with picture processing signals for TV, VTR, or the like, and thereby allows the data corresponding to them to be written into the write line buffer memory 41. The $\overline{SRC}$ pin 33 receives external pulses in accordance with picture processing signals for TV, VTR, or the like, and thereby allows readout of data from the read line buffer memory 39 to the data output.

The following procedures describe according to the invention the realization of the functions of accepting picture signals from a TV tuner or VTR, reproducing the picture, and writing necessary picture information such as characters at any location on the picture, and monitoring of the display.

For performing these functions, as diagrammed in FIG. 2, an external control signal $\overline{PIN}$ at pin 29 is caused to go to a low level "L". Instead of receiving the signal $\overline{PIN}$ as an external signal as herein, the $\overline{PIN}$ signal may not be controlled by external means but may be selectively provided with a high level "H" or low level "L" potential by an internal connection (under preparation of two types of etching masks for A1 wiring). In one construction, when the $\overline{PIN}$ signal is at a low "L" level, $\phi_r$ is low "L", and thereby the operation of the write line buffer memory 41 ceases. This is realized by turning transistors T11 and T12 off.

The pointer position of the serial read pointer 35 is incremented by the "H"→"L"→"H" change of the signal $\overline{SRC}$. This is the same as the serial pointer 43 in FIG. 1. When $\overline{RE}$ is high "H", all outputs of the serial read pointer 35 are positioned at a low "L", and the output at the pointer position goes to "H" when $\overline{RE}$ is at a low "L" and $\overline{SRC}$ is at a low "L". Likewise this can be readily realizable with logic circuits, so examples of a circuit for this aspect are omitted. The serial write pointer 37 is different only in respects of using the $\overline{SWC}$ signal instead of $\overline{SRC}$ and the $\overline{WE}$ signal instead of $\overline{RE}$, and has a similar operation.

Figure 3:
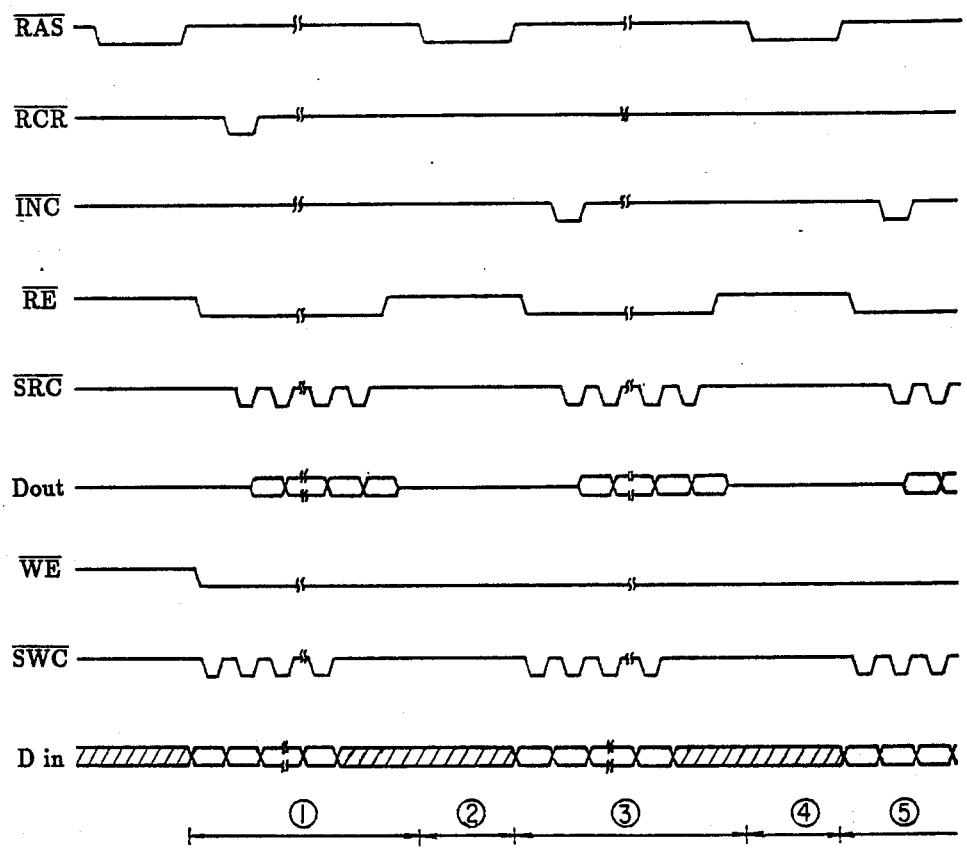
FIG. 3 is a timing chart of writing subpicture data in the operation of the picture processing memory system of FIG. 2.
Figure 4:
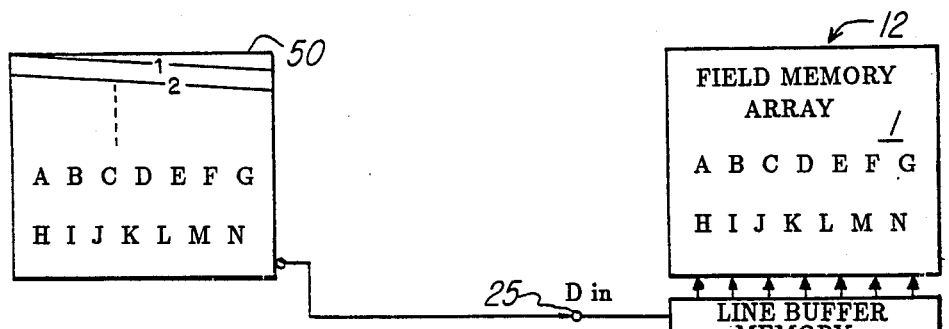
FIG. 4 is a schematic diagram of a signal transmission path between a data processor, such as a computer, and a field memory array in accordance with the present invention.

First of all, to insert a picture, such as a set of characters, data of the set of characters is written into the field memory array 1. FIG. 3 is a timing chart showing the timing sequence when data of previously formed characters are written in to the field memory array 1. FIG. 4 illustrates the path along which signals are transmitted. In FIG. 3, during time duration ①, the first line of a picture frame that is to be inserted is serially input as data signal $D_{IN}$ at an input terminal 25 and written into the read line buffer memory 39. During the same time duration, the $\overline{RCR}$ signal falls to a low "L" and resets the row address counter 5, which results in changing the address to a "1". During time duration ②, the data stored in the read line buffer memory 39 is written into the field memory array 1 at row address "1". The address has already been set to "1" during time duration ① and so, when the $\overline{RAS}$ signal goes to low "L", the word line is activated, and only words of address "1" become selectively active. At this time, $\overline{WE}$ is at a low "L" and thus $\phi_T$ changes to "H". Then the information stored in the read line buffer memory 39 is input to and stored in the field memory array 1. During time duration ③, data of the next line of the picture frame is again serially input to the $D_{IN}$ terminal 25 and written into the read line buffer memory 39. Simultaneously during time duration ③, $\overline{INC}$ changes to a low "L", and the value of the row address counter 5 is incremented by one to address "2". During time duration ④, the data stored in the read line buffer memory 39 is written into the field memory array 1, being stored at row address "2" of the field memory array 1. This procedure is repeated until all of the necessary data has been stored in the field memory array 1. This procedure is similar to the writing of line data into the field memory array 1 shown in FIG. 1. It is however different in that the unit of FIG. 2 is provided with terminals 27 and 33 for receiving the $\overline{RE}$ and $\overline{SRC}$ signals and except when monitoring the written information, $\overline{RE}$ is kept at a high "H" during time durations ① and ③. Then $D_{OUT}$ at terminal 23 goes to the high impedance state. Thereby the common line connected to $D_{OUT}$ can be released for another system.

If $\overline{RE}$ is at a low "L", and $\overline{SRC}$ is input under at least one pulse-delay in relation to $\overline{SWC}$, then the procedure is the same as carried out in the operation of the field memory 10 as shown in FIG. 1. Of course, the procedure is asynchronous and so has a line memory function.

Now an example where the stored information in the field memory array 1 is superimposed on a VTR image will be described with reference to the timing chart of FIG. 5.

Figure 5:
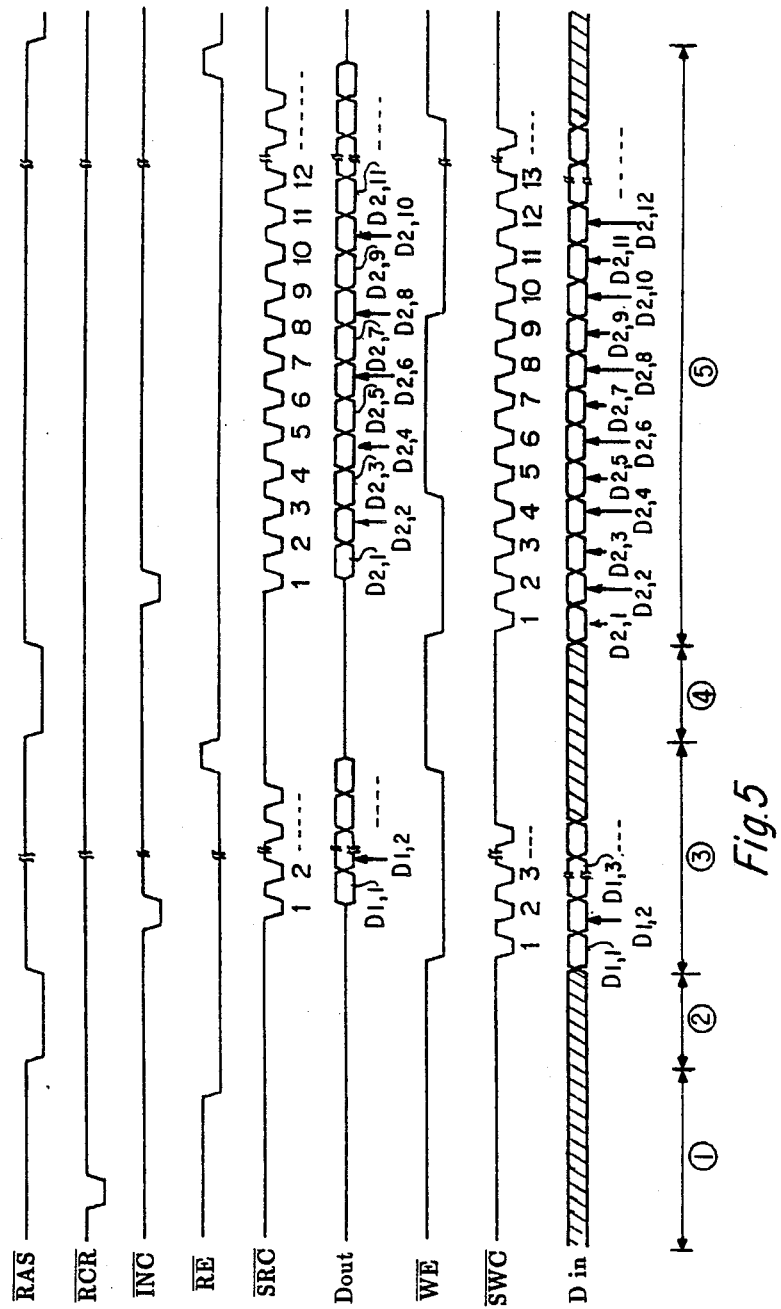
FIG. 5 is a timing chart of reproducing a subpicture in the operation of the picture processing memory system of FIG. 2.

In FIG. 5, ① designates the time duration when the row address counter 5 is reset, and ② the time duration during which information for the superimposition is read out from the field memory array 1 to the read line buffer memory 39. Of course, information in the read line buffer memory 39 unless it is to be inserted, is retained by keeping $\overline{RE}$ at a high "H". During time duration ③, VTR image signals are input at $D_{IN}$ and stored. This is entirely the same as the time duration ① in FIG. 3. During this duration, $\overline{INC}$ changes to a low "L", which results in one increment of the row address of the row address counter 5. During time duration ④, the data of the row following the row readout during time duration ② is read out. In time duration ⑤, and during the 1st–4th cycles duration, VTR image signals are readout, during the 5th to 9th cycles, the information stored in the read line buffer memory 39 is readout, and during 10th and the subsequent cycles, the VTR image is again readout.

Such combined procedures as described above enable, if effectively used, characters, or the like to be written at any location. So long as new data is not written into the field memory array 1, that is, so long as $\overline{RAS}$ has not changed to a low "L" and $\overline{WE}$ to a low "L", such characters are preserved, and hence can be superimposed repeatedly in each VTR image frame. Thus, the field memory array 1 is usable as a device for the superimposition of information on a VTR image.

Figure 6:
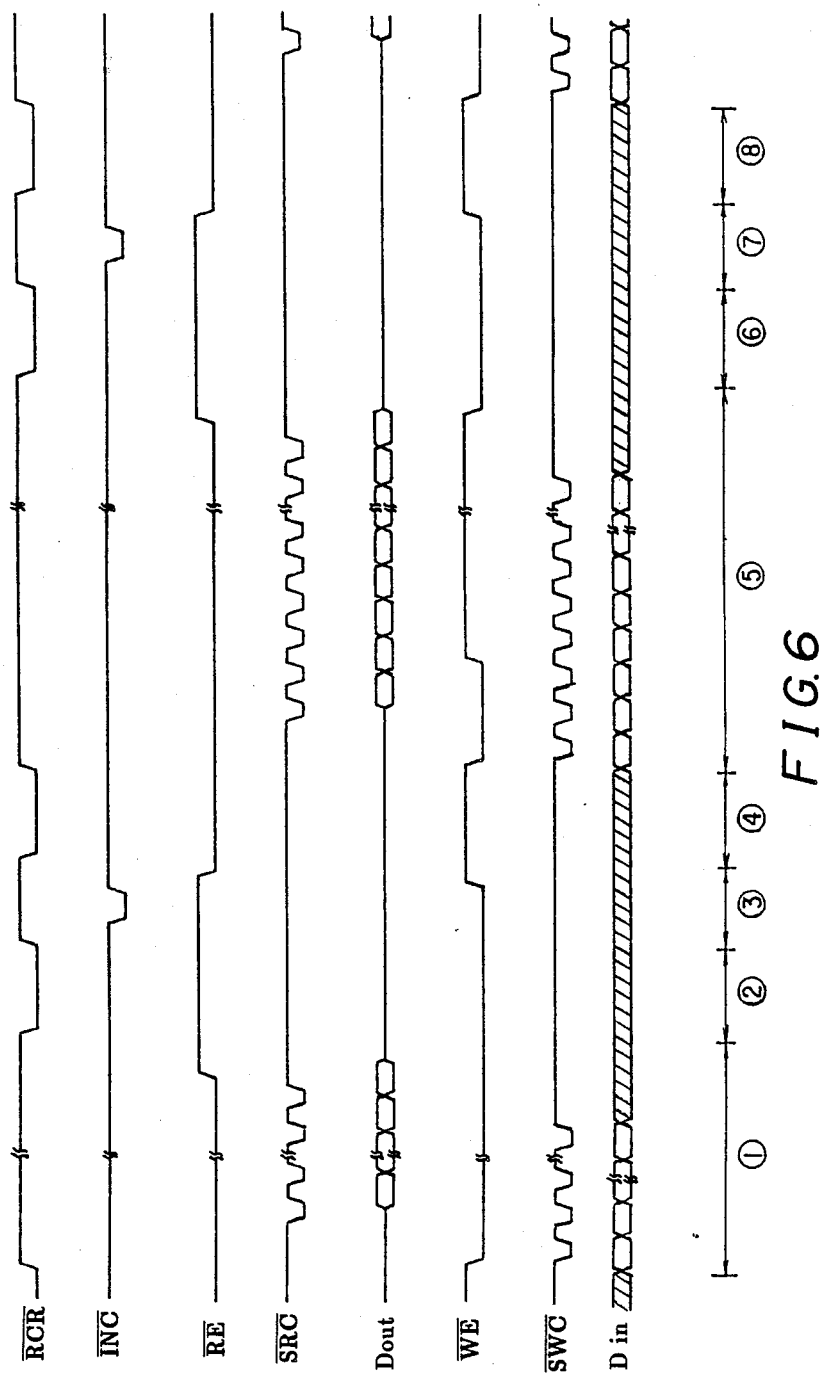
FIG. 6 is a timing chart of reproducing a still picture in the operation of the picture processing memory system of FIG. 2.

In FIG. 6, the shift of $\overline{INC}$ timing and the above-mentioned writing into the field memory array 1 enables superimposition of characters, or the like, on a still picture, and this procedure is usable as a memo for the picture hard-copied. In FIG. 6, time durations ① and ⑤ are for writing serial data and picture-in-picture data into the write line buffer memory 41. The mode of time durations ② and ⑥ depends on which data is stored into the field memory array 1. Time durations ③ and ⑦ are provided for address incrementation, and time durations ④ and ⑧ mark the time periods defined by the data that is readout from the field memory array 1 into the read line buffer memory 39 after an address increment.

Figure 7:
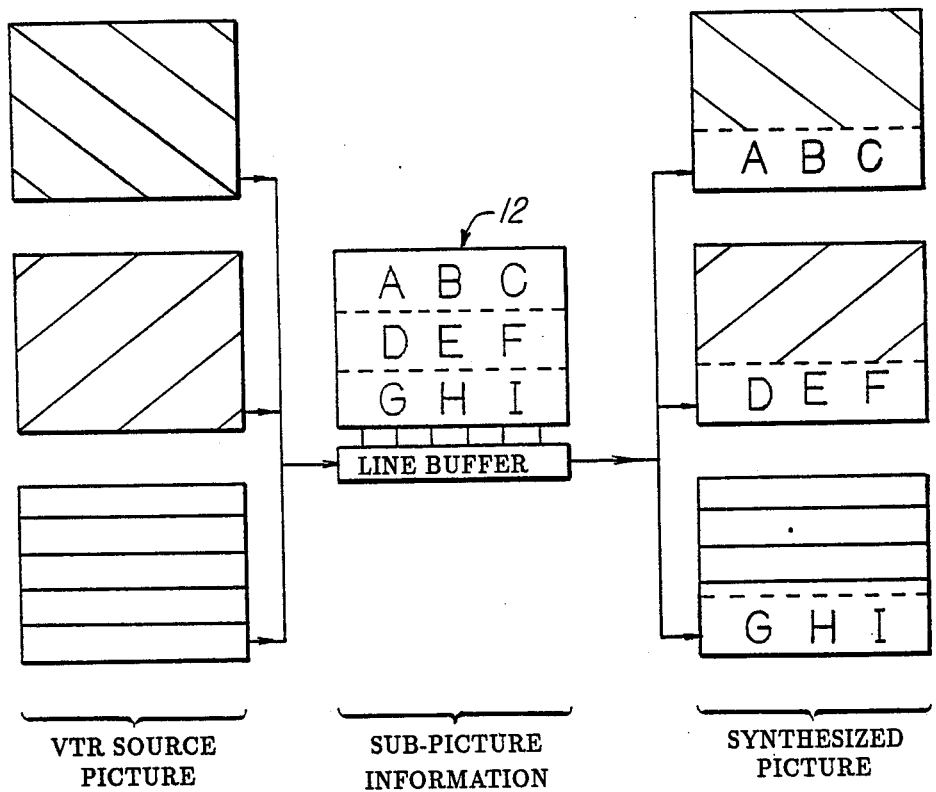
FIG. 7 is a schematic block diagram of a transmission path of subpicture signals in the operation of the picture processing memory system of FIG. 2.

The description given above has been made on the assumption that the row addresses of the VTR signals are regenerated to form one picture in agreement with the row addresses of the field memory array 1. As shown in FIG. 7, however, information stored in the field memory array 1 can be divided by suitable control of row addresses in the field memory array ①into a number of parts or subpictures which can be separately superimposed.

The following description is for the procedure when $\overline{PIN}$ at terminal 29 is at a high "H" and the unit 12 functions as both field memory and line memory. When $\overline{PIN}$ is set to a high "H", $\phi_I$ is set to a high "H" as well, and the write line buffer memory 41 begins to operate. When $\overline{RAS}$ at terminal 11 is at a high "H" and $\overline{WE}$ is at a low "L" and once $\overline{PIN}$ changes to a low "L", $\phi_W$ is changed to a high "H". Then, input data $D_{IN}$ through terminal 25 is written into the read line buffer memory 39. When $\overline{RAS}$ is at a high "H" and once $\overline{PIN}$ changes to a high "H", $\phi_W$ is changed to a low "L" independent of the position of $\overline{WE}$. Owing to $\phi_I$ staying at a high "H", $\overline{WE}$ changes to a low "L" and the output of the serial write pointer 37 is changed selectively to a high "H" (this is the same when $\overline{PIN}$ is at either a high "H" or a low "L"), and the input data $D_{IN}$ through terminal 25 is written into the write line buffer memory 41. The written data is also written into the read line buffer memory 39 and the field memory array 1 by changing $\overline{RAS}$ to a low "L" and $\overline{WE}$ to a low "L". Under the subsequent condition where $\overline{RAS}$ is at a high "H" and $\overline{RE}$ is at a low "L", the readout is made by changing $\overline{SRC}$ from "H"→"L"→"H"→"L". This is the so-called 1 H-delayed readout which effectively operates when a drop out of the input signal occurs.

Figure 8:
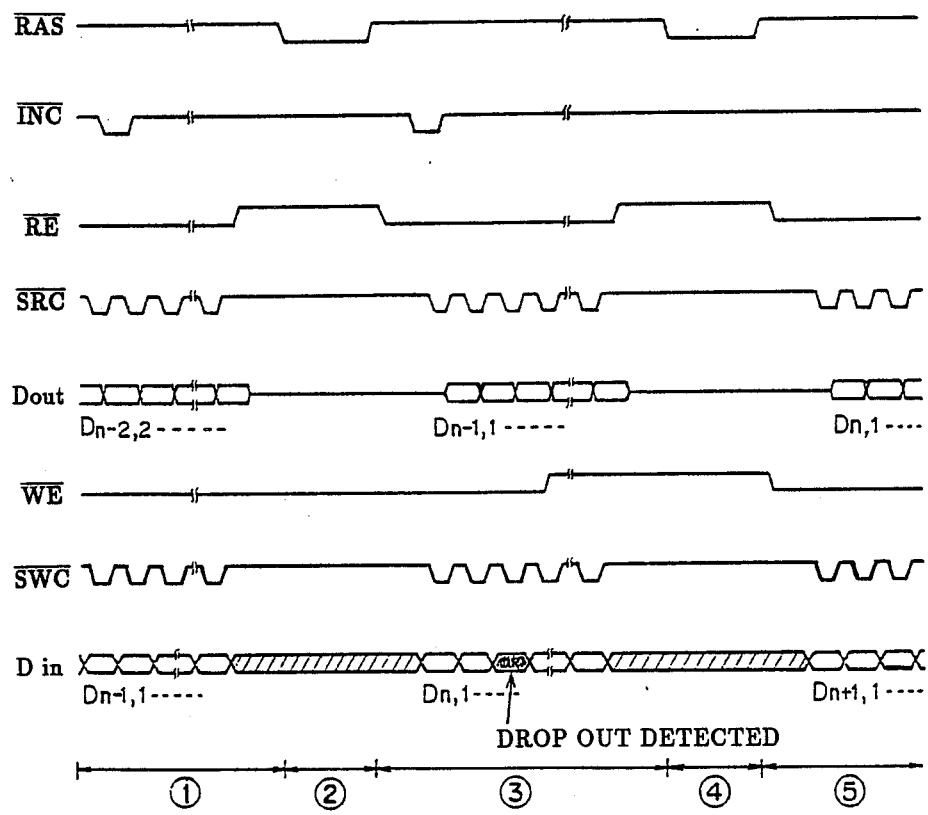
FIG. 8 is a timing chart of drop out detection in the operation of the picture processing memory system of FIG. 2.

Referring to the timing chart shown in FIG. 8, during time duration ①, drop out-free data from $D_{IN}$: $D_{n-1}$, 1..., is written serially into the write line buffer memory 41. During time duration ②, $\overline{RAS}$ is at a low "L", $\overline{RE}$ is at a high "H", and $\overline{WE}$ is at a low "L". By a combined logic circuit, $\phi_T$ and $\phi_W$ (FIG. 2) are changed to a high "H", and thus the data is written from the write line buffer memory 41 into both the field memory array 1 and the read line buffer memory 39. During time duration 3, the data written during time duration ① is readout from the read line buffer memory 39, (that is, a 1H-delayed readout). Furthermore, as distinguished from when $\overline{PIN}$ is at a low "L", the data content of the read line buffer memory 39 can be readout during this time duration under the timing of $\overline{SRC}$ which is independent of the timing of write ($\overline{SWC}$) because the data content cannot be subjected to writeover during the same time duration, i.e. as long as $\overline{RAS}$ stays at a high "H". Such operation is preferred for use as a time base correction. Besides, there is a 1H-delay between the written data and the readout data, and thus addition and subtraction of these portions of data enable a comb filter to be realized. (A similar function can be performed with the line memory shown in FIG. 1.)

Referring to the timing chart of FIG. 8, if drop out is detected with respect to the data from $D_{IN}$, during time duration ③, it is possible to invalidate the data written into the write line buffer memory 41 within the cycle of time duration ③ by changing $\overline{WE}$ to a high "H" before at least the next $\overline{RAS}$ is changed to a low "L". It is time duration ④ during which $\phi_W$ is held at a low "L" while $\phi_T$ is changed to a high "H" and the data of the read line buffer memory 39 is written into the field memory array 1. Also the content of the read line buffer memory 39 is preserved, and thus the field memory array 1 receives the data of time duration ① a second time, i.e., the data readout from $D_{OUT}$ during time duration ⑤ is the data written during time duration ①, as well. Human vision will not sense as unnatural a display based upon the same data of about 2 rows of output which are repeated. On the other hand, the output of data subjected to drop out may be sensed as a notable flaw on the display screen.

In this way, the unit 12 can be used for correcting a data drop out occurrence. (The line memory shown in FIG. 1 has a similar function). Always the field memory array 1 contains the monitored data so that the content of th field memory array 1 can be readout, as desired. Such a function can be performed by changing $\overline{RE}$ to a low "L" and $\overline{WE}$ to a high "H" when $\overline{RAS}$ goes to a low "L". This is just the function of the field memory unit 12 shown in FIG. 2.

Figure 9:
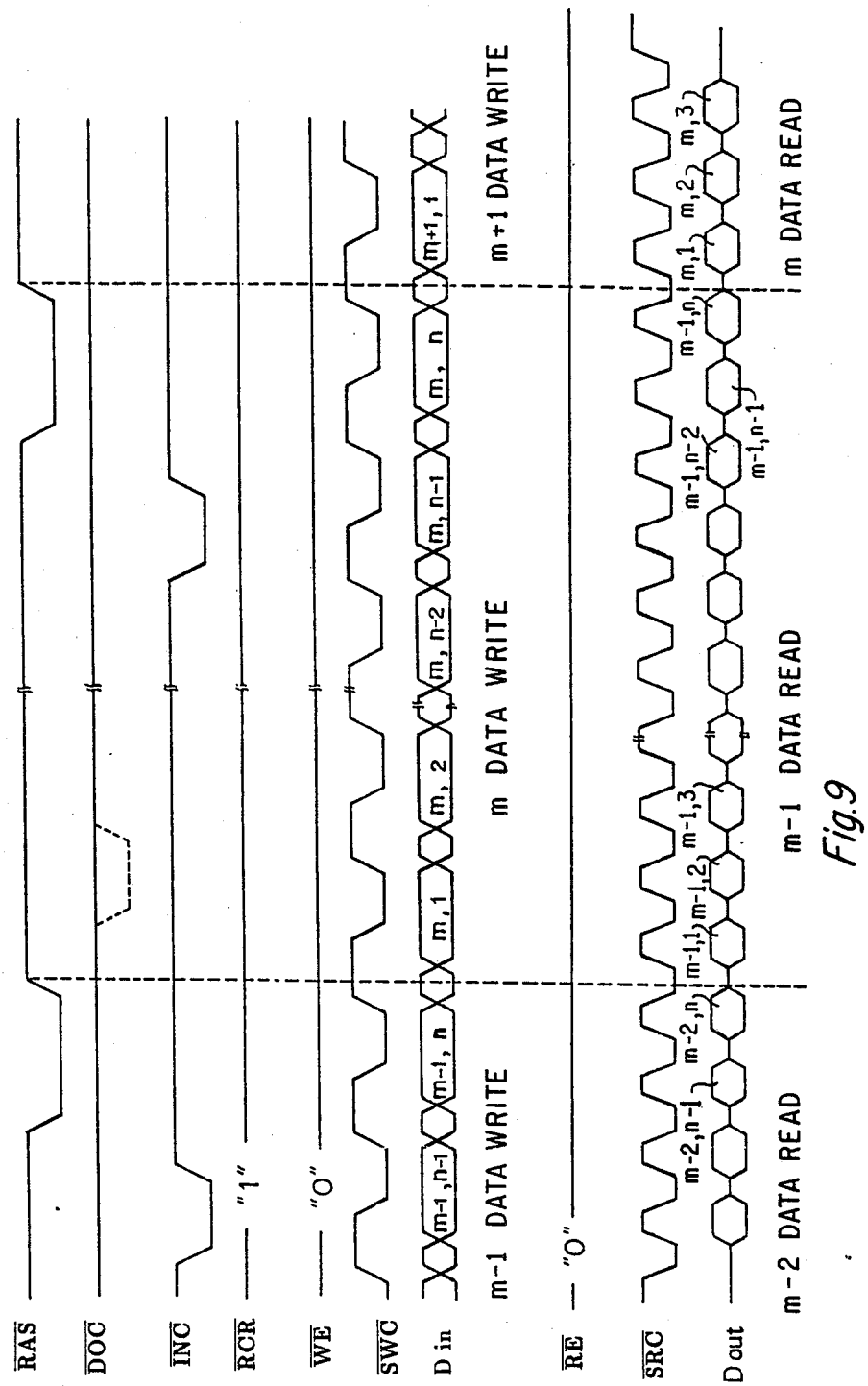
FIG. 9 is a timing chart of write in-readout in the operation of the picture processing memory system of FIG. 2.
Figure 10:
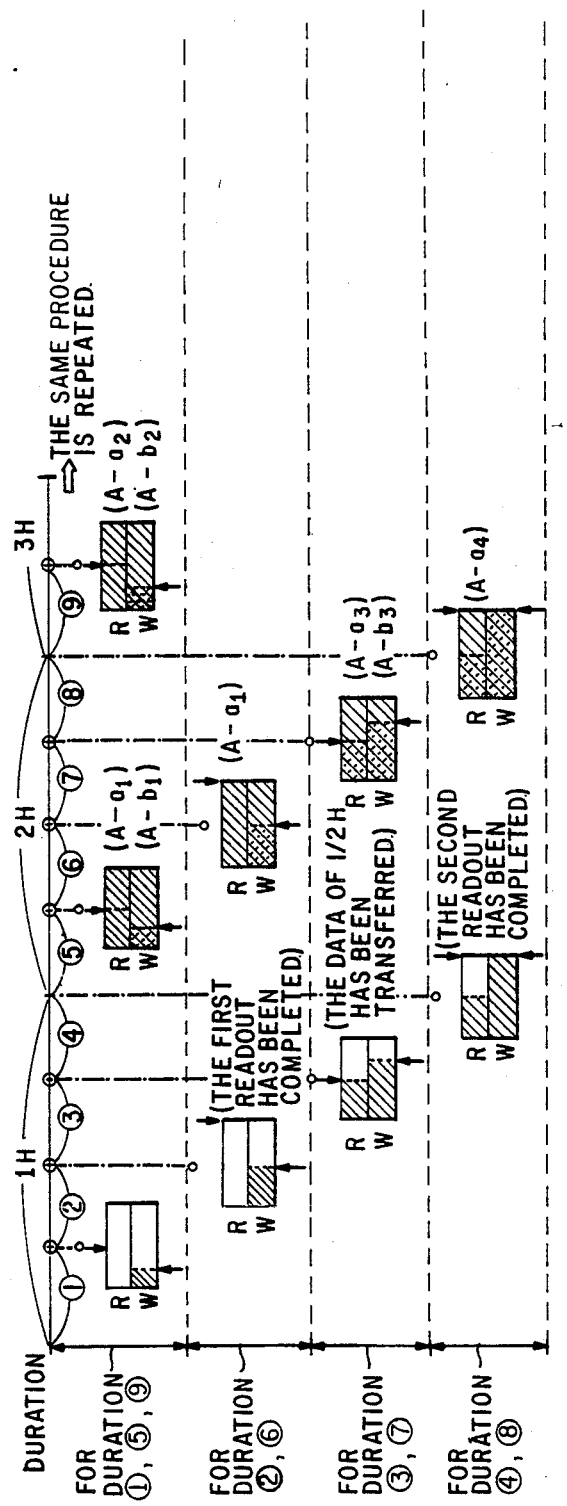
FIG. 10 is a schematic diagram illustrating the basic procedure of picture processing in accordance with the present invention.

FIGS. 9 and 10 illustrate a second embodiment of the invention.

This embodiment of the picture processor comprises, as in the case of the previously described embodiment of FIG. 2, a field memory and line memories. None of such memories of conventional type is capable of realizing the following functions:

(1) Interlace-to-noninterlace conversion

With one chip, double speed-sequential scanning conversion could not be realized in real time. So far, therefore, real time interlace-to-noninterlace conversion has been performed with a plurality of field memories and a plurality of line memories.

(2) The prior art field memory, in addition to the problem under the preceding (1), needs time for transferring the written data to the memory array, and hence is incapable of writing all data included in 1 H of picture frame.

These problems (1) and (2) must be overcome without damaging the functions of the conventional field memory. In the embodiment of FIGS. 9 and 10, there is provided in one chip a means for satisfactorily treating such problems. Referring to the block diagram of FIG. 2, there is illustrated a field or frame memory array 1 for storing video data involving at least one frame; a write line buffer memory 41 having the function of writing in video data included in 1 H(1 scan line) of frame sequentially in synchronism with image processing signals of a TV, VTR, etc., a read line buffer memory 39 having the function capability of subjecting the data written by the write line buffer memory 41 to interlace to non-interlace conversion and then reading out the resulting data; and a circuit section for receiving external signals and sequentially generating internal addresses.

Accordingly the above-stated problems can be overcome in such a way that during the period for writing the data included in 1 H of frame by the write line buffer memory 41, once the data portion corresponding to ½ H has been written, this data portion is then transferred to the read line buffer memory 39, and then readout from the read line buffer memory 39 at a speed twice that than by the write line buffer memory 41.

This embodiment of the picture processor is similar to that in FIG. 2 except that a drop-out-control pin with the signal ($\overline{DOC}$) is additionally provided.

The function of $\overline{DOC}$ is that once drop out, or the like, has been detected, the data of the write line buffer memory 41 is not written but the data of the read line buffer memory 39 is written into the memory array 1. (This operation is allowed when $\overline{DOC}$ is at a low "L".) So long as $\overline{DOC}$ is at a high "H" and $\overline{WE}$ is at a low "L", the data written in the write line buffer memory 41 is automatically transferred every ½ H from the write line buffer memory 41 to the read line buffer memory 39 and then to the memory array 1 (assuming that $\overline{SWC}$ always is receiving external pulses at a speed in accordance with the image processing signals of the TV or VTR). When $\overline{WE}$ is at a high "H", the data of the memory array 1 is transferred every ½ H to the read line buffer memory 39 (assuming that $\overline{SRC}$ always is receiving external pulses at a speed in accordance with the image processing signals of the TV or VTR).

In this embodiment, the cycle time of the pulse ($\overline{SRC}$) is assumed to be ½ of that of $\overline{SWC}$.

FIG. 9 is a timing chart of the write/read format in non-interlace format.

$\overline{INC}$ and $\overline{RCR}$ are received at the rising edge of $\overline{RAS}$ at which $D_{IN}/D_{OUT}$ load the data in the succeeding row. Thus, at $D_{OUT}$, the data which is readout is the data in the preceding row which is being written at $D_{IN}$. In FIG. 9, $\overline{DOC}$ is at a high or "1" and so compensation for drop out is avoided.

In the description which follows, the main operation for image processing will be described with reference to FIG. 10 in which (buffer) R designates "read line buffer" memory 39 and (buffer) W "write line buffer" memory 41.

The symbols appearing in FIG. 10 are intended to represent the following information:

↓ indicates a time when either the read line buffer memory 39 or the write line buffer memory 41 has been activated;

represent data storage states;

It is assumed that while data is being stored into the read line buffer memory 39, data is being stored in the memory array 1 at the same time;

A-a$_1$: the first readout of the data transferred during the preceding cycle begins;

A-b$_1$: the data of the second ½ H written during the preceding cycle has been transferred;

A-a$_2$: the first readout of the data transferred during the preceding cycle begins;

A-b$_2$: the data of the second ½ H written during the preceding cycle has been transferred;

A-a$_3$: the second readout of the data transferred during the preceding cycle begins;

A-b$_3$: once readout of the first ½ H of the preceding cycle has been completed, the data of the first ½ H of the current cycle is transferred; and A-a$_4$: the second readout of the data transferred during the preceding cycle has been completed.

The operations of buffers W and R during time durations 1 through 9 will be described in sequence and the operations are accomplished as a rule on the assumption that buffer W writes essential data included in 1 H in synchronism with video signals used for image processing, and buffer R is read out at a speed twice that of the write in by buffer W.

Duration ① (0<Wp<¼ H of 1st H)

Wp designates a more active present point than the serial write pointer 37.

Buffer W performs write in of data between 0 and ¼ H in the 1st H in synchronism with the image processing signals of the TV or VTR.

Buffer R performs readout of the data previously stored between 0 and ½ H at a speed twice that than by buffer W.

Duration ② (¼ H≦Wp<½ H of 1st H)

Buffer W, following duration ①, performs write in of data until ½ H.

Buffer R performs readout of the previously-stored data at a speed twice that than by buffer W, and thus can complete readout of the data included in 1 H stored.

Duration ③ (½ H≦Wp≦¾ H of 1st H)

Buffer W, following duration ②, writes data of the segment from ½ H to ¾ H.

Buffer R begins the second readout of the previously stored data and can readout data of the segment until ½ H at the time when buffer W has written until ¾ H.

At this time, the data portions written during durations ① and ② are transferred and stored into buffer R as follows: Directly after buffer R has passed the second ½ H, i.e. under the timing of Wp=¾ H+α, the data included in the first ½ H segment (written during durations 1 and 2 ) of the 1st H is transferred and stored into buffer R (where 0≦α≦¼ H). Furthermore simultaneous writing into the memory array 1 is allowed.

In addition, if drop out of regenerated signals caused by a flaw on the tape of the VTR, or the like, is detected during durations ① and ②, the data portions written during these durations are not transferred to buffer R and the memory array 1. Buffer R remains and holds the stored data and the data of buffer R is rewritten into the memory array 1 at a one-incremented row address. In this way, the duration corresponding to the segment of from ½ H to (¾ H+α), which is time length: (¼ H+α), is useful in judging whether drop out compensation with respect to data portions written in during durations ① and ② should be made or not. For instance, if the time length (1 H)=63.5 μsec, the time length (¼ H+α)=15.8 μsec+α. This time length is sufficient for drop out compensation in a TV or video system. Accordingly in this case, α may be considered only from the viewpoint of device circuitry, and can be adequate if it has one clock length of the SRC clock.

Duration ④ (¾ H≦Wp≦1 H of 1st H)

Buffer W completes write in of all data included in the 1st H.

Buffer R completes the second readout of the previously-stored data.

Duration ⑤ (0<Wp≦¼ H of 2nd H)

Buffer W, in the same way as in duration ①, writes data of the segment 0-¼ H of the 2nd H.

Buffer R begins the first readout of the data transferred to buffer R during duration ③ (the data potions written into buffer W during durations ① and ②, corresponding to the first ½ H of the 1st H) and can readout the first ½ H.

Then, as during duration ③, the data portions written into buffer W during durations ③ and ④ are transferred and stored into buffer R as follows: Directly before the first readout by buffer R reaches the ½ H point: under the timing of $$(\tfrac{1}{4} H - \beta) = 15.8 \ \mu sec - \beta,$$

the data portions are transferred. Adequate β is determined by including time taken for data transfer from the viewpoint of device circuitry, and within the range between ¼ H and 500 nsec. This time length is sufficiently small compared to 15.8 μsec. and is therefore an adequate time for drop out compensation in a video system, such as TV. Then simultaneous writing into the memory array 1 is carried out.

Duration ⑥ (¼ H≦Wp≦½ H of 2nd H)

Buffer W, following duration ⑤, writes the data potion until ½ H of the 2nd H, which corresponds to duration ②.

Buffer R completes the first readout of the data (All data included in the 1st H) stored in buffer R.

Duration ⑦ (½ H≦Wp≦¾ H of 2nd H)

Buffer W, following duration ⑥, writes the data portion until ¾ H of the 2nd H.

Buffer R performs the second readout of the data stored in buffer R, and can complete the readout until ½ H of the 2nd H at the time when $$Wp = \tfrac{3}{4} H.$$

In the same way as described in connection with duration ③, the data portions stored in buffer W during durations ⑤ and ⑥ are transferred and stored into buffer R. Thus buffer R stores respective data included in the first ½ H of the 2nd H and the second ½ H of the 1st H. Time for determining whether compensation for drop out should be made or not is the same as during duration ③: (¼ H+α)=15.8 μsec+100 nsec.

Duration ⑧ (¾ H≦Wp≦H of 2nd H)

Buffer W following duration ⑦ works to complete write in of all data included in the 2nd H.

Buffer R completes the second readout of the data in the 1st H.

Duration ⑨ (0≦t<¼ H of 3rd H)

Buffer W writes the first ¼ H of data of the 3rd H.

Buffer R, in the same way as described under the previous duration ⑤, begins the first readout of the first ½ H of the 2nd H (data portion transferred during duration ⑦).

The transfer of the second ½ H of the 2nd H, which is conducted is the same as described in connection with duration ⑤, and is completed before buffer R has accomplished readout of the first ½ H of the 1st H. Time for determining whether drop out compensation should be made or not is the same as under duration ⑤.

The cycle comprising operations under Duration ① through Duration ⑧ is repeated, which enables successive write in of video data every 1 H of a picture frame in a video system, such as TV, with compensation for drop outs, and with real time conversion from interlace to non-interlace scanning. By virtue of this procedure, the data of the first ½ H can be transferred into the read line buffer memory 39 without using the $\overline{RAS}$ clock. Moreover, the data of the preceding cycle is included in the second ½ H, and by the utilization of this feature, interlace/non-interlace scanning may be accomplished in real time without data blank, thus enabling the interlace-to-noninterlace conversion with a single integrated circuit chip instead of using a plurality of integrated circuit chips for this purpose as in the prior art.

In addition, the present emodiment enables interlace-to-noninterlace scanning to occur not only in the case where data transfer is accomplished in the direction from the write line buffer memory 41 to the read line buffer memory 39 and to the memory array 1, but also in the case of the data transfer direction from the memory array 1 to the read line buffer memory 39. In the latter respect, conversion of interlace to non-interlace scanning can be accomplished in the same manner successively with respect to the data of one field or frame.

The concept of this invention further may enable in real time and n-times higher speed readout which is applicable to another type of speed-conversion memory, such as a first in, first out memory (FIFO).

Moreover as described above, the read line buffer memory 39 always can perform readout of data in one-row preceding or 1H-delayed data with respect to the write line buffer memory 41. Picture processing may occasionally require 1 H±x bits-delayed data. In the above-mentioned case, on the assumption that readout speeds of the read and write line buffer memories 39 and 41 are the same, a delay of 0.5 H+x (x=time taken for data transfer) can be produced by the means that when the write line buffer memory 41 has completed the write in of ½ H and the data transfer to the read line buffer memory 39 has been completed, readout from the read line buffer memory 39 is begun. Besides, also a delay of 1.5 H−x (x=time taken for data transfer) would be feasible. Merely when data is readout in the "interlace" system, therefore, it follows that an adjustment of (0.5 H+x) to (1.5 H−x)

can be made.

It will be evident that various modifications can be made to the described embodiments without departing from the scope of the present invention.

The present invention is characterized, as described above, as comprising a memory array for storing video data involving at least one picture frame and line buffer memories for rapidly processing video data included in one line of a picture frame, thereby having advantages: firstly, in providing a picture processor having the desired video data processing functions without needing external address signals and the capability of performing the additional function of reproducing an arbitrary subpicture at any intended location, as on a TV or VTR screen, and secondly in providing a picture processor having the functions of both line memory and field memory, as of still picture, twice higher speed and slow reproduction, drop out correction, time base corrector function, interlace to non-interlace conversion, etc.

What is claimed is:

1. A picture processor comprising:
    a memory array for storing video data involving at least one picture frame; and
    line buffer memory means for processing at a high rate video signals included in one scan line of the picture frame; said line buffer memory means including
    a read line buffer memory operatively connected to said memory array, and
    a write line buffer memory operatively connected to said memory array.

2. A picture processor as set forth in claim 1 wherein said memory array comprises a field memory array for storing video data involving at least one picture frame; and
    wherein said line buffer memory means is capable of asynchronously writing and reading video data included in one scan line of a picture frame; and further including
    a circuit section for receiving external signals and generating sequentially internal addresses.

3. A picture processor as set forth in claim 1 wherein said memory array comprises a frame memory array.

4. A picture processor as set forth in claim 1 wherein said read line buffer memory is selectively usable as a read-only read line buffer memory.

5. A picture processor as set forth in claim 4 wherein the write line buffer memory is capable of writing video data included in one scan line asynchronously with the timing of video data readout by said read line buffer memory.

6. A picture processor as set forth in claim 1 wherein said read line buffer memory is capable of reading at a twice-higher rate than the writing rate of the write line buffer memory.

7. A picture processor as set forth in claim 6 wherein the write line buffer memory is capable of sequentially writing video data per scan line synchronously with picture processing signals for a video display; and
    the read line buffer memory is capable of reading data written by said write line buffer memory under conversion from interlaced to non-interlace scanning; and further including
    a circuit section for receiving external signals and generating sequentially internal addresses to control said memory array and said write and read lie buffer memories.

8. A picture processor comprising:
    a memory array for storing video data including at least one picture frame;
    a first buffer memory operatively connected to the memory array;
    a second buffer memory operatively connected to the first buffer memory and the memory array;
    interface means for transferring serial video data to said memory array and operatively connected to said first and second buffer memories; and
    control circuit means operatively connected to said interface means, the memory array, the first buffer memory and the second buffer memory for regulating the transfer of video data into and out of said memory array via said first and second buffer memories.

9. A picture processor as set forth in claim 8 wherein said first buffer memory comprises:
    a first memory having a predetermined number of storage locations, and
    a first location pointer operatively connected between said interface means and the predetermined number of storage locations of the first memory.

10. A picture processor as set forth in claim 9 wherein said second buffer memory comprises:
    a second memory having a predetermined number of storage locations, and
    a second location pointer operatively connected between said interface means and the predetermined number of storage locations of the second memory.

11. A picture processor as set forth in claim 10 wherein said interface means comprises an input terminal and an output terminal.

12. A picture processor as set forth in claim 11 wherein said interface means further includes a switching circuit operatively arranged to selectively connect the input terminal to the first location pointer and to the second location pointer.

13. A picture processor as set forth in claim 11 wherein said interface means further includes a switching circuit operatively arranged to selectively connect the output terminal to the first location pointer and to the second location pointer.

14. A picture processor comprising:
    a memory array for storing picture data;
    a first buffer memory for buffering of video data in parallel arrangement to the memory array;
    a second buffer memory for buffering of video data in parallel arrangement to the memory array and the first buffer memory;
    interface means for transferring serial video data to said memory array and operatively connected to said first and second buffer memories; and
    control circuit means operatively connected to said interface means, the memory array, the first buffer memory and the second buffer memory for controlling the buffering of the parallel video data and interfacing of the serial video data.

15. A picture processor as set forth in claim 14 wherein said first buffer memory comprises:
    a first memory having a predetermined number of storage locations for storing the data in parallel arrangement with the memory array, and
    a first location pointer operatively connected between said interface means and the predetermined number of storage locations of the first memory for serially transferring data between the first memory and the interface means.

16. A picture processor as set forth in claim 15 wherein said second buffer memory comprises:
a second memory having a predetermined number of storage locations for storing data in parallel arrangement with the memory array, and
a second location pointer operatively connected between said interface means and the predetermined number of storage locations of the second memory for serially transferring data between the interface means and the second memory.

17. A picture processor as set forth in claim 16 wherein said interface means comprises an input terminal for applying serial data to the memory array and an output terminal for receiving serial data from the memory array.

18. A picture processor as set forth in claim 17 wherein said interface means further includes a switching circuit operatively arranged for selectively connecting the input terminal to the first location pointer and to the second location pointer.

19. A picture processor as set forth in claim 17 wherein said interface means further includes a switching circuit operatively arranged for selectively connecting the output terminal to the first location pointer and to the second location pointer.

20. A method of processing picture data comprising the steps of storing picture data in a memory array;
buffering data in parallel arrangement with the memory array in a first buffer memory;
buffering data in parallel arrangement with the memory array and the first buffer memory in a second buffer memory;
transferring serial data between an interface section and the first and second buffer memories; and
controlling the buffering of he parallel and serial data for regulating the transfer of data into and out of the memory array via the first and second buffer memories.

21. A method as set forth in claim 20 wherein buffering data in the first buffer memory comprises:
storing data in a first memory having a predetermined number of storage locations, and
serially transferring data between the interface section and storage locations within the first memory with a first location pointer.

22. A method as set forth in claim 21 wherein buffering data in the second buffer memory comprises:
storing data in a second memory having a predetermined number of storage locations, and
serially transferring data between the interface section and storage locations within the second memory with a second location pointer.

23. A method as set forth in claim 22 wherein serially transferring data between the interface section and storage locations within the first memory includes selectively connecting an input terminal of the interface section to the first location pointer.

24. A method as set forth in claim 23 wherein serially transferring data between the interface section and storage locations within the first memory includes selectively connecting an output terminal of the interface section to the first location pointer.

25. A method as set forth in claim 24 wherein serially transferring data between the interface section and storage locations within the second memory includes selectively connecting an input terminal of the interface section to the second location pointer.

26. A method as set forth in claim 25 wherein serially transferring data between the interface section and storage locations within the second memory includes selectively connecting an output terminal of the interface section to the second location pointer.

27. A picture processor comprising:
a memory array for storing video data involving at least one picture frame;
buffer memory means including a read line buffer memory means, and a write line buffer memory means;
said read line buffer memory means being operatively connected to said memory array and being alternatively switchable between a first state in which said read line buffer memory means serves as a line buffer memory for processing at a high rate video signals included in one scan line of the picture frame storable in said memory array and a second state in which said read line buffer memory means serves as a read-only line buffer memory, and
said write line buffer memory means being operatively connected to said memory array and to said read line buffer memory means for writing video data included in one scan line of said picture frame asynchronously with the timing of data read out by said read line buffer memory means when serving as said read-only line buffer memory.

28. A picture processor comprising:
a memory array for storing video data involving at least one picture frame; and
line buffer memory means for processing at a high rate video signals included in one scan line of said picture frame, said line buffer memory means including a write-only line buffer memory section and a read line buffer memory section capable of reading data at a rate twice that of the writing rate of said write-only line buffer memory section.

29. A picture processor as set forth in claim 28, wherein said write-only line buffer memory section is a write line buffer memory for sequentially writing video data per scan line synchronously with picture processing signals for a video display, said read line buffer memory section is a read line buffer memory having the capability of reading data written by said write line buffer memory undergoing conversion from interlace to non-interlace scanning; and
circuit section means for receiving external signals and generating sequentially internal addresses to control said memory array and said write and read line buffer memories; and
said write and read line buffer memories and said circuit section means being provided on a single integrated circuit chip.

* * * * *